United States Patent
Neer et al.

(10) Patent No.: US 6,793,517 B2
(45) Date of Patent: Sep. 21, 2004

(54) ADAPTER MODULE WITH RETENTION LATCH

(75) Inventors: Jay H. Neer, Boca Raton, FL (US); Christopher P. Dirkers, Calico Rock, AK (US)

(73) Assignee: Molex Incorporated, Lisle, IL (US)

(*) Notice: Subject to any disclaimer, the term of this patent is extended or adjusted under 35 U.S.C. 154(b) by 0 days.

(21) Appl. No.: 10/408,506

(22) Filed: Apr. 7, 2003

(65) Prior Publication Data

US 2004/0029447 A1 Feb. 12, 2004

Related U.S. Application Data

(60) Provisional application No. 60/370,853, filed on Apr. 8, 2002.

(51) Int. Cl.[7] .............................................. H01R 13/631
(52) U.S. Cl. ...................................... 439/372; 439/638
(58) Field of Search ................................ 439/372, 638, 439/786, 787, 138, 144, 147

(56) References Cited

U.S. PATENT DOCUMENTS

| | | | |
|---|---|---|---|
| 4,154,495 A | * | 5/1979 | Crewse ........................ 439/144 |
| 4,204,738 A | | 5/1980 | Tillotson ..................... 439/369 |
| 4,376,563 A | | 3/1983 | Margrave et al. |
| 4,671,594 A | | 6/1987 | Ohtsiki et al. |
| 4,787,858 A | | 11/1988 | Killian, Jr. |
| 4,897,039 A | | 1/1990 | Uchida et al. |
| 4,969,838 A | | 11/1990 | Himes, Jr. et al. |
| 5,076,803 A | | 12/1991 | Mutarelli et al. ............ 439/493 |
| 5,666,266 A | | 9/1997 | Katoh et al. |
| 5,879,173 A | | 3/1999 | Poplawski et al. |
| 5,901,263 A | | 5/1999 | Gaio et al. |
| 5,924,886 A | | 7/1999 | Achammer et al. |
| 6,000,957 A | | 12/1999 | Betker et al. |
| 6,062,893 A | | 5/2000 | Miskin et al. |
| 6,135,793 A | | 10/2000 | Babineau |
| 6,142,802 A | | 11/2000 | Berg et al. |
| 6,351,394 B1 | | 2/2002 | Cunningham |
| 6,439,918 B1 | | 8/2002 | Togami et al. |
| 6,533,603 B1 | | 3/2003 | Togami et al. .............. 439/372 |
| 6,652,298 B2 | * | 11/2003 | Ohnuki ........................ 439/372 |

OTHER PUBLICATIONS

International Search report in PCT Application No. PCT/US03/10743, the PCT counterpart of the present application.

* cited by examiner

*Primary Examiner*—Renee Luebke
(74) *Attorney, Agent, or Firm*—Thomas D. Paulius

(57) ABSTRACT

An adapter module is provided with a bail latch mechanism that serves to engage and disengage the frame into which the adapter module fits. The bail latch is movable between two positions and it engages a cam member formed as part of the module that cams two opposing free ends of the bail latch inwardly into the module to thereby release it from the adapter frame.

20 Claims, 11 Drawing Sheets

ADAPTER MODULE WITH RETENTION LATCH

REFERENCE TO RELATED APPLICATIONS

This application claims priority of U.S. provisional Patent Application No. 60/370,853, filed Apr. 8, 2002.

BACKGROUND OF THE INVENTION

The present invention relates generally to adapter modules, and more particularly to an adapter module having a retention member that is easily operable to hold the adapter module in place or to release it from within an adapter frame.

Adapter frames or modules are used in many different applications and are usually used to contain an electrical component, such as an optical transceiver or a cable to board connector. Adapter modules are used in a wide variety of applications that range from simple connecting faces between hard (copper) conductor wiring to more sophisticated applications that may involve optical fibers, flexible or printed cables, etc. In many instances, adapter modules house converters that are used to convert optical signals or electrical signals or electrical signals to optical signals. These modules are used to convert high speed signals from either copper to optical or optical to copper, while maintaining the signals at high speeds, such as in the gigabit range. These adapter modules are placed into adapter frames that are usually attached to a circuit board, and the modules are retained in place in the adapter frames by retention means.

One such retention means is the use of thumbscrews. These thumbscrews are difficult to operate in environments with many cables, for the user has to move the cables to the side when installing, removing or reconfiguring the cables. Thus, these adapter modules are not easily pluggable.

Accordingly, the present invention is directed to an improved adapter frame, or module having a simple to use retention means that renders the adapter frame or module more like a pluggable component.

SUMMARY OF THE INVENTION

It is therefore a general object of the present invention to provide an adapter module that easily slides into a an adapter frame and which uses a moveable latch to retain it in place within the frame.

Another object of the present invention is to provide an adapter module that utilizes a simple wire bail latch having two free ends that engage openings in the frame, and the bail latch is moveable about its free ends between two positions, wherein in one of the two positions, the free ends of the bail latch extend outwardly from the adapter module to provide interfering posts that serve to retain the adapter module in place within the adapter/frame and in the other of the two positions, the free ends of the bail latch are withdrawn inwardly into the adapter module so that they do not interferingly engage the adapter frame to thereby permit the adapter module to be easily removed from the bezel.

A further object of the present invention is to provide an adapter module with a retention bail latch that is moveable between two positions wherein the adapter module is either retained within a guiderail or removable therefrom, the bail latch preventing the cable assembly from being attached to the transceiver within the adapter module prior to installation of the adapter module into its host unit.

Yet another object of the present invention is to provide an adapter module with a moveable bail latch as described above, the module having a housing with a cam member formed therein proximate to the free ends of the bail latch, the bail latch engaging the cam members in its movement to thereby draw the bail latch free ends inwardly into the adapter module during movement of the bail latch to an open position.

A still further object of the present invention is to provide an adapter module that is easily insertable into an adapter frame, the adapter module having a cast housing that has a pair of slots formed therein extending lengthwise, the slots receiving corresponding opposing guiderails of a receiving frame, the adapter module slots having flared ends at their rear portions that provide a lead-in for the guiderails, the flared ends diverging from the width of the slots to a wider slot at an daiverging angle therefrom so that the module may be tilted in its installation and/or removal.

The present invention accomplishes these and other objects and aspects by virtue of its structure. In one principal aspect of the present invention, an adapter module is provided with a means for securing it in place within an adapter frame that is mounted to a circuit board. The module has a hollow body that is sized to receive therein an electronic device such as a connector, transceiver, optical to electrical connector or the like and the device may have a circuit board that extends outwardly therefrom for mating with an opposing connector mounted to the circuit board. The module body further may include an exterior flange that extends around it for flush engagement with either a faceplate or the front edge of an adapter frame mounted to the circuit board.

The securing means preferably takes the form of a bail latch that has a general U-shape with two free ends. The free ends are received within openings formed in the module sidewalls and the free ends are interconnected by a horizontal bar that extends across the front of the module.

The bail latch is moveable between two operative positions. In the first operative position, the bail latch bar lies across the front of the module and prevents connection therewith of any cable assemblies. In the second operative position, the bail latch is raised permitting insertion of cable assemblies into the module. The module includes a pair of cam members having cam surfaces that the bail latch rides open in its movement. These cam members serve to draw the free ends of the bail latch inwardly so that the module may be inserted into, or removed from, the adapter frame. When the free ends of the bail latch are not cammed inwardly, they extend through an exterior of the module sidewalls and into an interference engagement with the adapter frame that prevents the module from being removed from the adapter frame.

In another principal aspect of the present invention, the adapter frame has a pair of guiderails that extend inwardly and the module has a pair of slots formed in its exterior that extend lengthwise of the module. These module slots receive the adapter frame guide rails. These slots open to the rear of the module and include a flared lead-in opening that permits the module to be tilted into place into the adapter frame or permit the module to be used with tilted adapter frames.

Electromagnetic gaskets may be applied to the module flange in an orientation to engage and mate with opposing gaskets on the adapter frame. The bail latch may also be configured to accommodate a cable assembly.

Other objects, features and advantages of the invention will be apparent from the following detailed description taken in connection with the accompanying drawings.

BRIEF DESCRIPTION OF THE DRAWINGS

The invention, together with its objects and the advantages thereof, may be best understood by reference to the following description taken in conjunction with the accompanying drawings, in which like reference numerals identify like elements in the figures and in which.

DETAILED DESCRIPTION OF THE PREFERRED EMBODIMENTS

Figure 1:
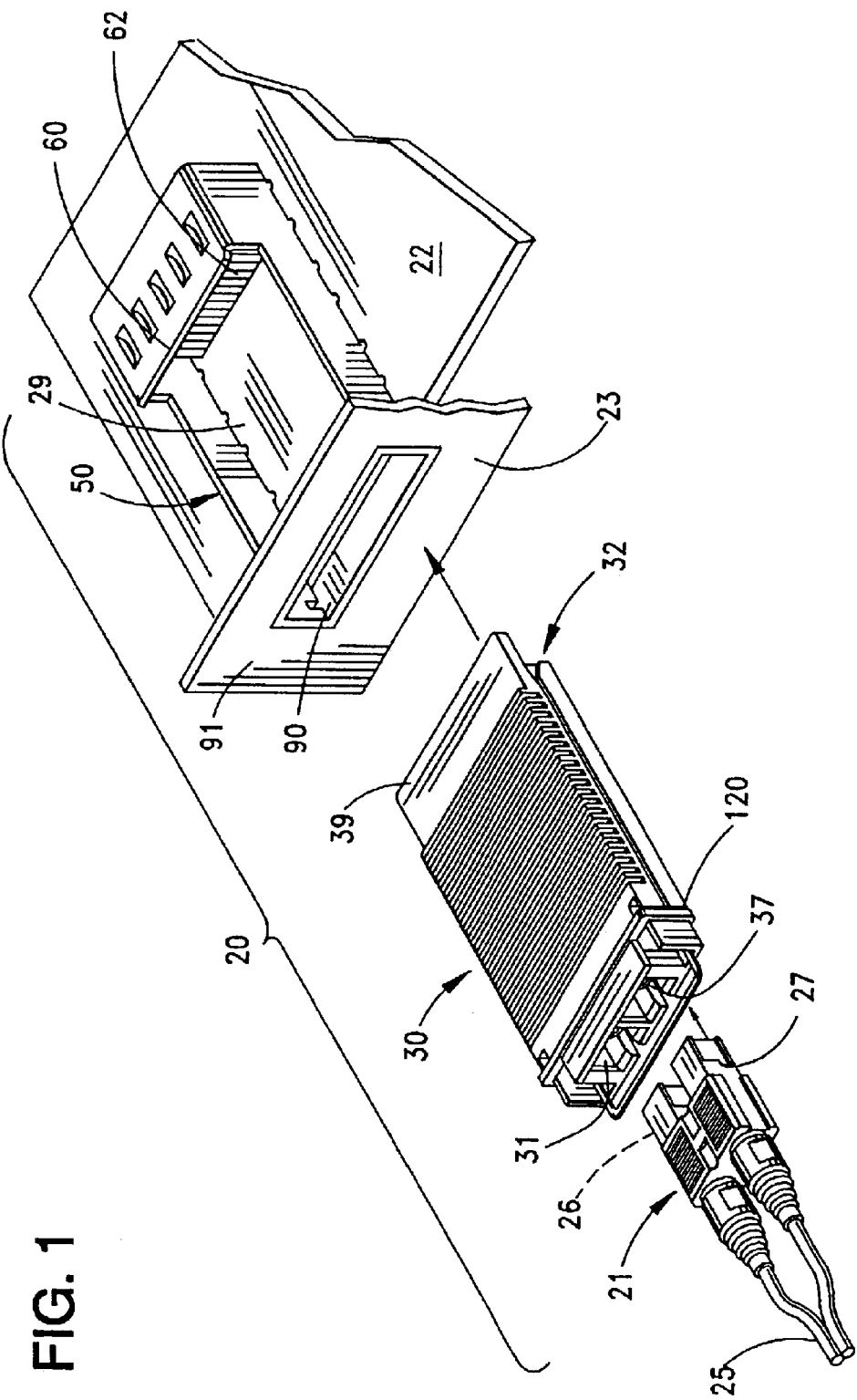
FIG. 1 is an exploded perspective view of an adapter frame/module assembly that utilizes an adapter module constructed in accordance with the principles of the present invention in its operational environment with a cable assembly.

FIG. 1 illustrates an electrical assembly 20 that is used to provide an interface between one device (not shown) that has a cable assembly 21 leading from it to another electronic device (also not shown) that has a circuit board 22 associated therewith and which is enclosed in a housing 23. Such assemblies are commonly used in the telecommunication industry and may include a fiber or other type of optical device that transmits signals through a fiber optic cable 25 which are terminated to one or more transmitters 26, that are housed within connector housing 27 that are illustrated as plug connectors in the drawings.

These cable assemblies 21 plug into what is known in the art as an adapter module 30 that in turn is received within an adapter frame 50 that is mounted to the circuit board 22 and that partially surrounds, or encloses, a connector 60 mounted on the circuit board 22 and having a plurality of conductive terminals 62 that are terminated to circuits on the circuit board 22.

Figure 4:
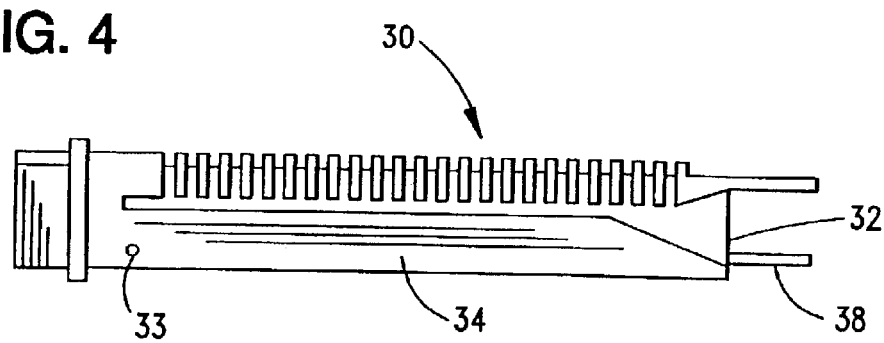
FIG. 4 is a side elevational view of the adapter module of FIG. 3, with the bail latch removed for clarity.

The module 30 houses one or more electronic devices, typically converters that connect high speed signals from copper cables or fiber optic cables to electrical signals that can be transmitted through the connector terminals 62 and onto the selected circuits on the circuit board 22. The electronic devices may typically include a pair of optical converter heads 37 that are contained in nests, or openings 31, of the module 30 and these conversion heads may include additional electronic structure that ends in a circuit board 38 (FIG. 4) that extends out from the rear face 32 of the module 30. One type of module and its internal components are illustrated and described in U.S. Pat. No. 6,062,893, issued May 16, 2000.

Figure 2:
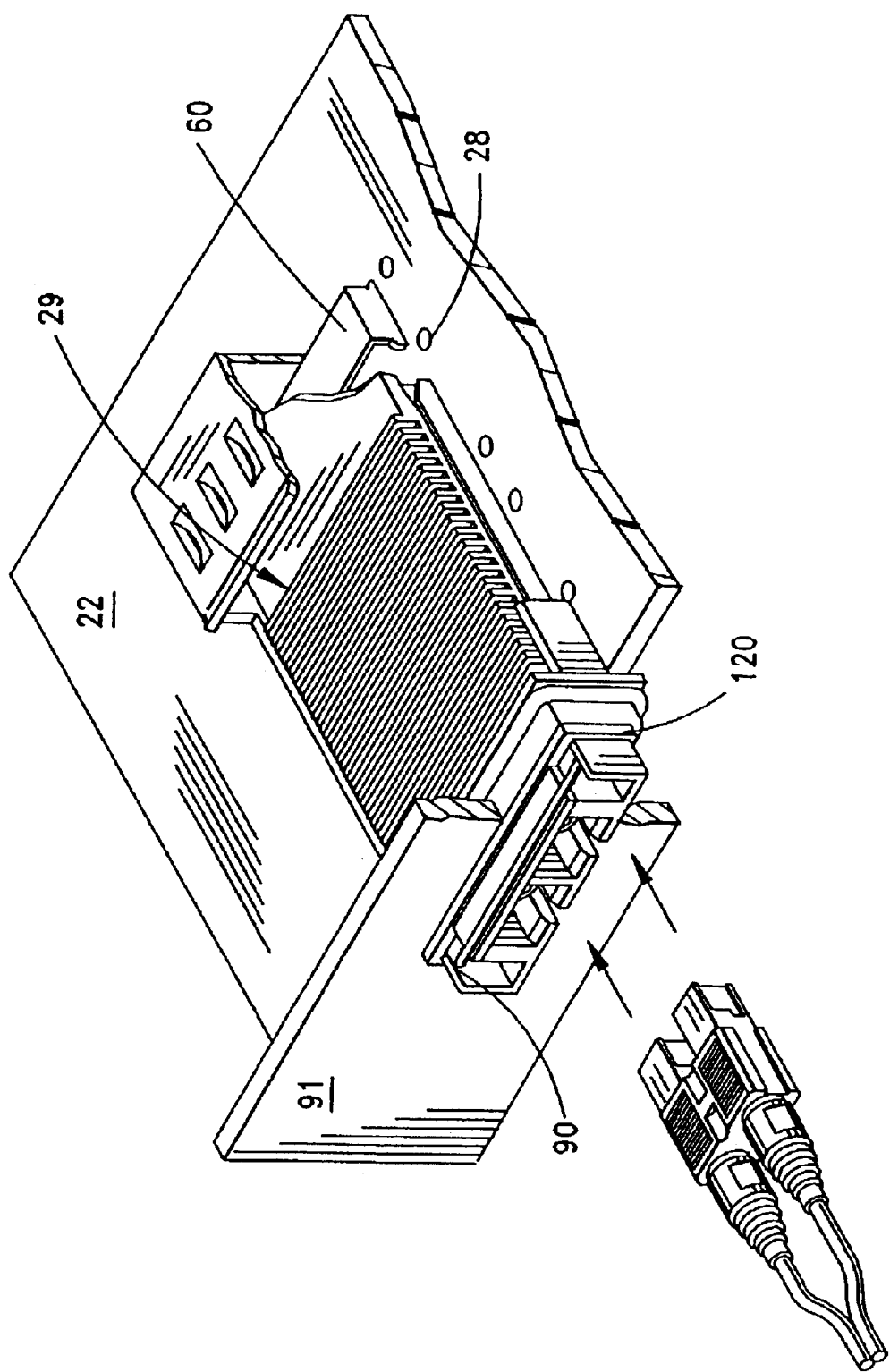
FIG. 2 is the same view as FIG. 1, but partially cutaway and illustrating the adapter module in place within its adapter frame and ready to receive the cable assembly therein.

The module 30 is received within an adapter frame 50 that is mounted to a circuit board 22. The adapter frame, as illustrated best in FIG. 3, has a rectangular shape with a pair of side walls 52 interconnected by opposing front and rear faces 53, 54. The rear face 54 of the adapter frame 50 includes a rear wall 55 that closes off the rear of the frame 50 and further includes a transverse rear member 56 with spring arms 57 formed therein that depend downwardly into the cavity 29 defined within the adapter frame 50. These spring arms 57 engage a rear ledge 39 (FIG. 1) formed in the module 30 in order to provide effective grounding of the module 30. This grounding into grounding circuits on the circuit board 22 occurs primarily by way of a series of engagement pins 58 that are preferably formed as part of the adapter frame 50 and which may be received within plated holes, or vias 28 (FIG. 2) formed in the circuit board 22.

Returning to FIGS. 3 and 3A, the module 30 is preferably die cast from a conductive material and may be formed of one or more parts with a hollow internal cavity (not shown) that receives and houses converters, of which only the connector heads 37 and the rear circuit board 38 are shown.

The front face of the module 30 has a pair of openings 31, each communicating with a specific converter head 37.

Figure 3:
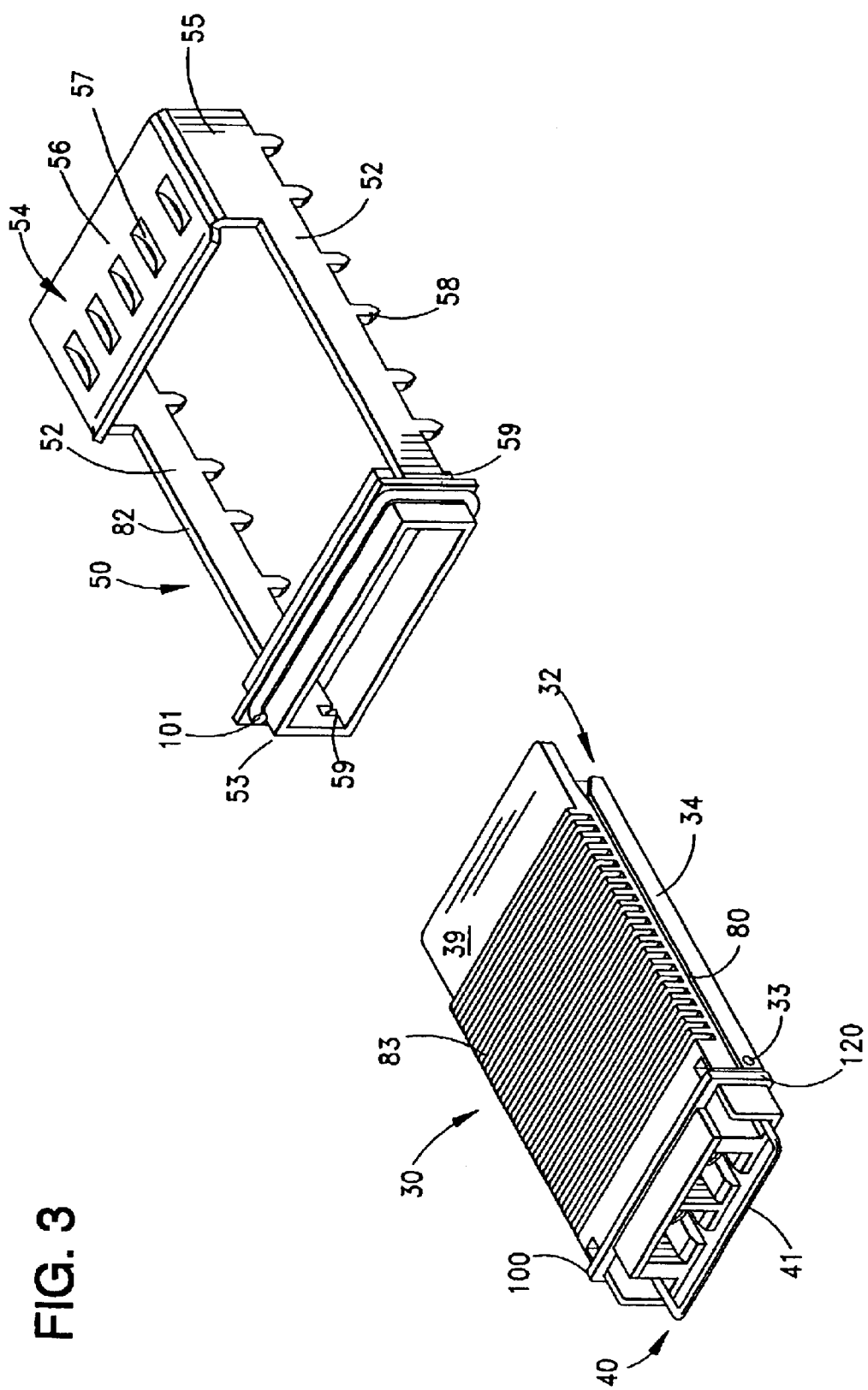
FIG. 3 is a perspective view of the adapter module and adapter frame of FIG. 1 in alignment with each other prior to insertion of the frame/module into the frame and illustrating the module in a position ready for insertion/removal from the frame.
Figure 8:
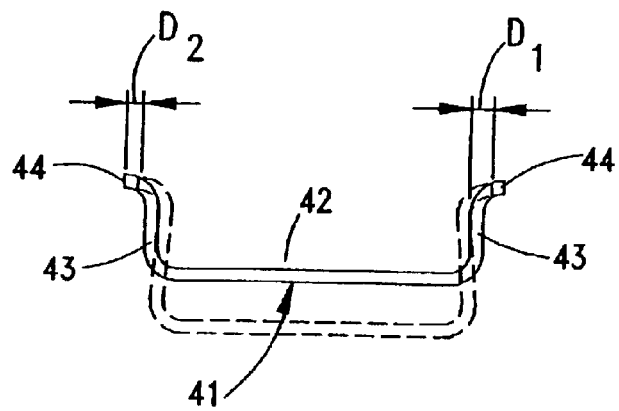
FIG. 8 is a diagrammatic view of the bail latch of the adapter module of the present invention illustrating the displacement that occurs therein during movement between its two operative positions.

These openings 31 receive the connector housings 27 of the cable assembly plug connectors. In order to retain the module 30, within the adapter frame 50, a retention means 40 is provided in the form of a moveable (or rotatable) bail latch 41. As illustrated in FIG. 8, the bail latch 41 has a general U-shape having a base 42 that extends transverse to two legs 43. The legs 43 terminate in free ends 44 that also extend in the transverse direction of these free ends 44 and are received within a pair of openings 33 (FIGS. 3 and 4) that are formed in the sidewalls 34. The free ends 44 are movable in the openings 33 so that the bail latch 41 may be moved (preferably rotated) between first and second operative positions. In the first operative position, which is illustrated in FIG. 3, the bail latch 41 extends horizontally in front of the movable openings 31 and its base part 42 extends crosswise in front of the module openings 31 in a manner so as to interfere with insertion of the cable connector housing 27 therein. In this same position, the free ends 44 are drawn inwardly of the module sidewalls 34 and adapt the position shown by the dashed lines in FIG. 8 where the free ends 44 are drawn and do not project outside of the module sidewalls 34, as illustrated in FIG. 3.

Figure 3A:
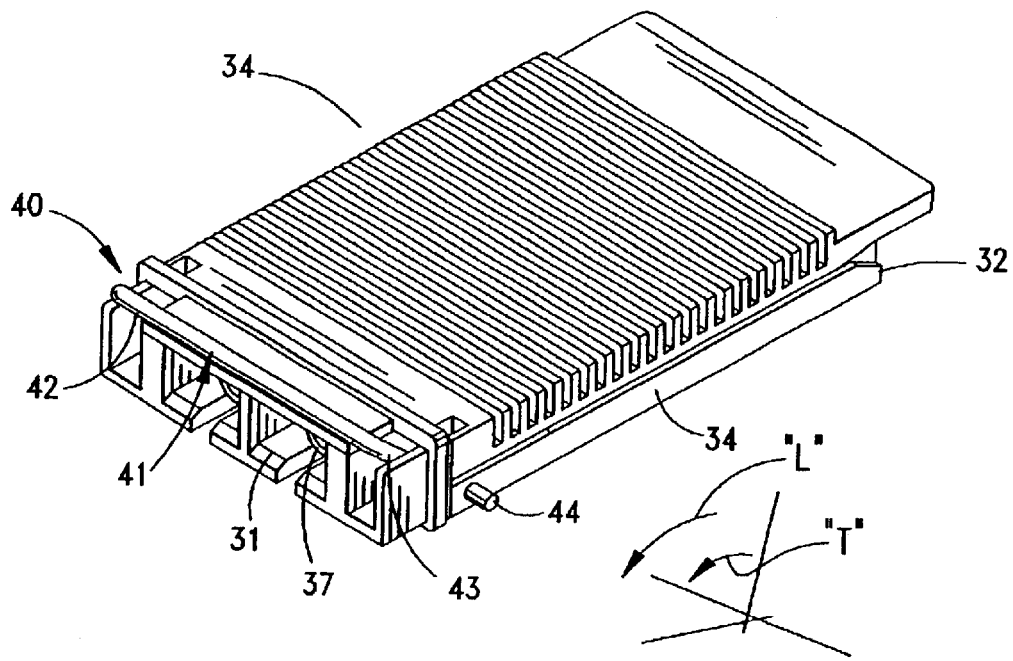
FIG. 3A is a perspective view of the adapter module of FIG. 3 with its bail latch moved to a retention or engagement position.
Figure 5:
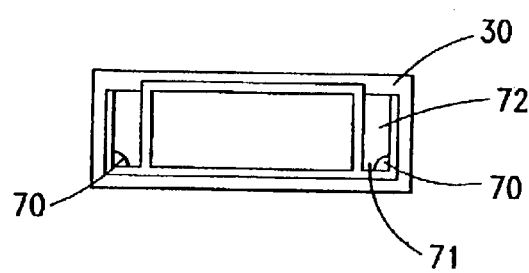
FIG. 5 is a front elevational view of the adapter module of FIG. 4.
Figure 6:
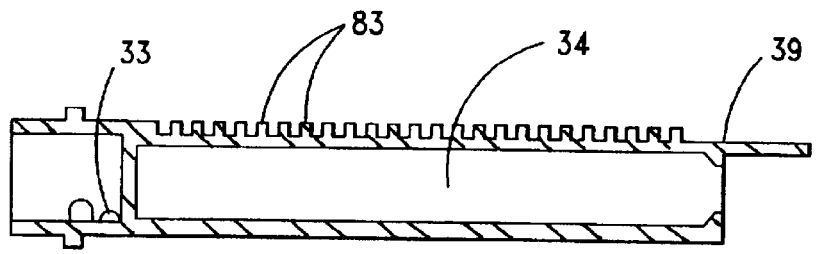
FIG. 6 is a lengthwise sectional view of the adapter module of FIG. 4.
Figure 9:
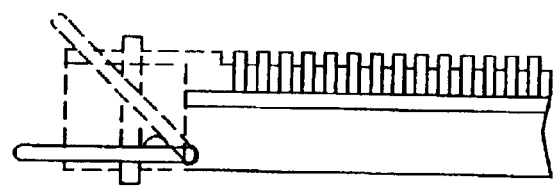
FIG. 9 is a partial side elevational view of the adapter module of the present invention illustrating the range of movement between the two positions of the bail latch.

In the second operative position, as illustrated in FIG. 3A, the bail latch 41 is raised up and over the openings 37 on the front face of the module 30. This position is shown in outline in FIGS. 8 and 9 and no interference is presented with any cable assemblies. In order to provide the inward-outwardly movement of the bail latch free arms 44 in concert with the upward-downward movement of the bail latch, the adapter module 30 includes a pair of cam members 70 that are preferably integrally formed with the module 30. As shown in FIG. 5, these cam members 70 are located along the inner base 71 of the slots 72. The cam member 70 are preferably three-dimensional bumps having covered surfaces that are curved with a radius both in the transverse direction "T" (FIG. 3A) and the longitudinal direction "L" so that the bail latch legs 43 will cam inwardly to pull the free ends 44 of the bail latch inwardly 20 that they do not project from the module sidewalls 34 and into the adapter frame openings 59.

Figure 7:
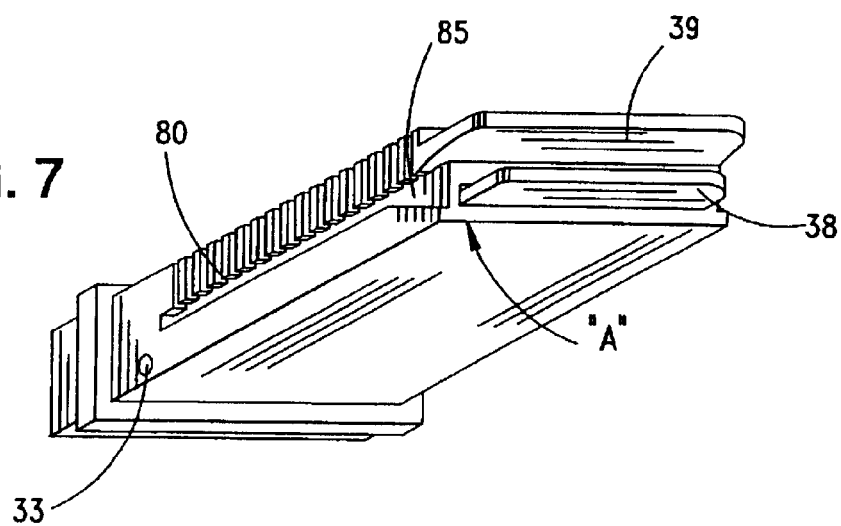
FIG. 7 is a perspective view of the adapter module of FIG. 4 taken from the underside thereof.
Figure 7A:
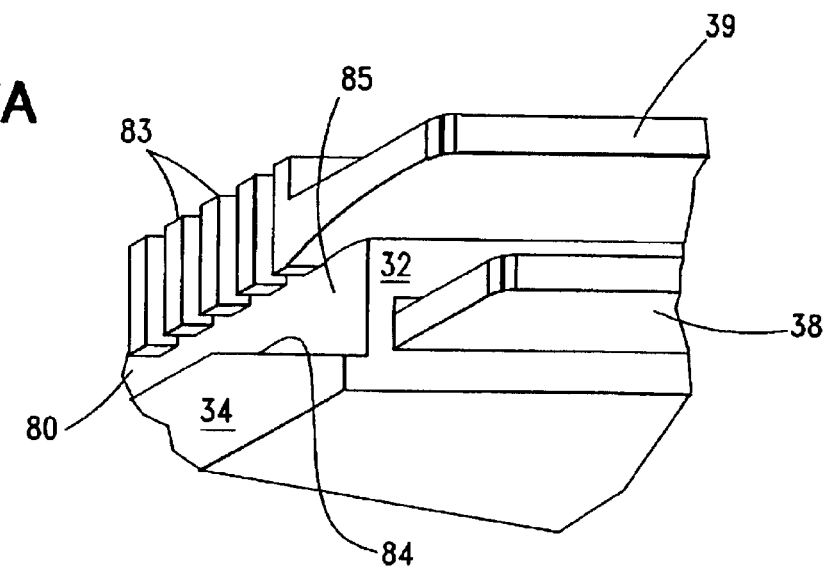
FIG. 7A is an enlarged detail view of the portion designated "A" in FIG. 7.

In another aspect of the present invention, the module 30, may have a pair of slots 80 formed therein that extend lengthwise of the module 30. These slots 80 receive and engage corresponding guiderails 82 that are formed as part of the adapter frame 50 and which bend inwardly into the internal cavity 29 of the frame 50. As seen best in FIGS. 7 and 7A, the slots 80 may be further disposed in the module sidewalls 34 just beneath the heat dissipating fins 83 that are preferably formed as part of the module 30. At the rear face 32 of the module 30, the slots 80 open in a diverging manner by way of an angled wall 84 to create a large opening 85 with an angled lead-in surface 84 that will permit the adapter module 30 to be tilted into place as to engage the adapter frame guiderails 82 or to engage an adapter frame 50 that is itself slightly tilted with respect to an opening 90 in a device foreplate, or bezel 91.

Figure 12A:
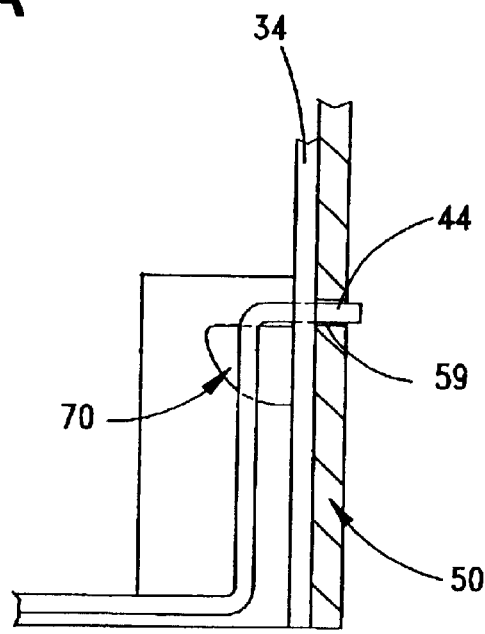
FIG. 12A is an enlarged detail view of the bail latch in a raised position such as is shown in FIG. 3A, with the bail latch positioned above the cam member.
Figure 12B:
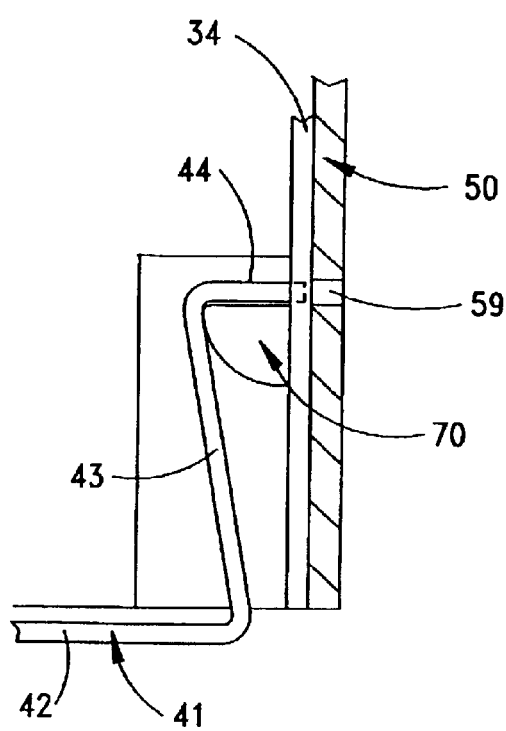
FIG. 12B is the same view as FIG. 12A, but with the bail latch in a depressed position as shown in FIG. 3 where the bail latch legs and free ends have deflected inwardly.

Turning now to FIGS. 12A and 12B, these figures show in detail the relationship between the cam member 70 and the bail latch 41. In FIG. 12A, the bail latch 71 extends up at an angle as in FIG. 3A and the latch legs 43 are positioned above the cam member 70. In FIG. 12B, the bail latch 41 has been moved down to a horizontal position as in FIG. 3 and it can be seen that the latch legs 43 have ridden down on the cam member 70 and so deflected inwardly. This deflection occurs along the latch legs 43 (shown as D1, in FIG. 8) and also along the latch free ends 44 (shown as D2 in FIG. 8). In this deflection, the free ends 44 are withdrawn from their engagement with the frame openings 59, and preferably partially into the module sidewall 34 so that the module 30 may be freely and easily inserted into and removed from the frame 50.

The module flange 120 may have an electromagnetic gasket 100 applied thereto as its rear face 50 so that it mates with a like electromagnetic gasket 101 supported on the adapter frame front face.

Figure 10:
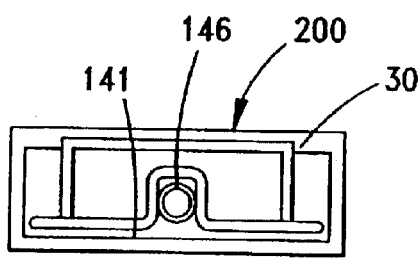
FIG. 10 is a front elevational view of an adapter frame/module having an alternative bail latch.
Figure 11:
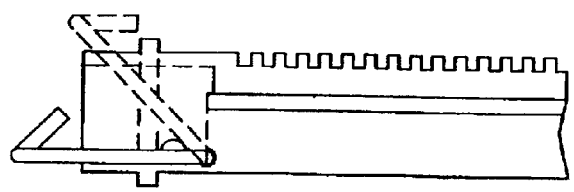
FIG. 11 is a partial side elevational view of the adapter frame/module of FIG. 10.

Another embodiment 200 is illustrated in FIGS. 10–11 where the module 30 includes a bail latch 141 that has a recess or slot 146 formed therein to receive a cable or patch cord.

Figure 13:
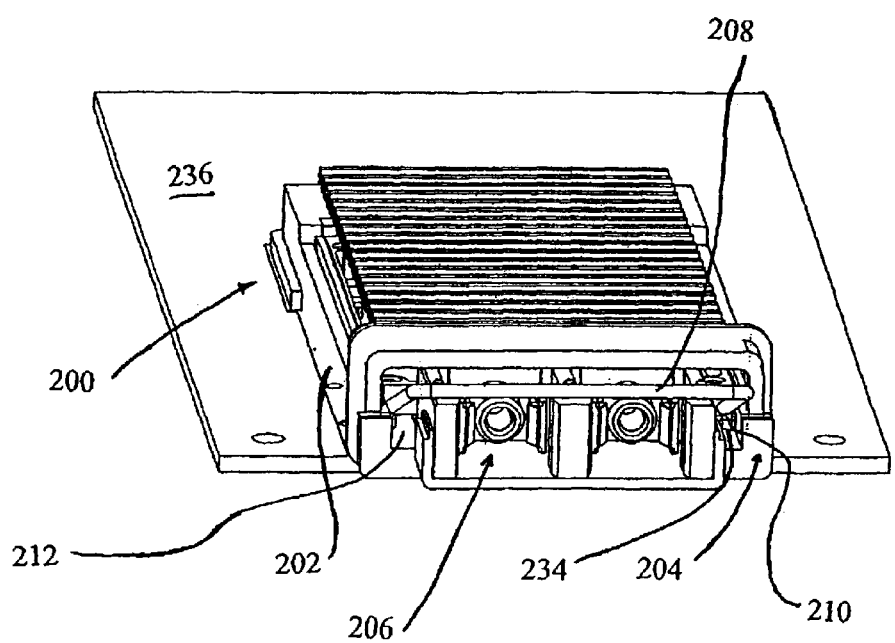
FIG. 13 is an angled perspective view of a module in place within an adapter frame and illustrating the bail latch in a up position, wherein the module is engaged with the adapter frame and which utilizes a cam member that is raised off the floor of the module.
Figure 14:
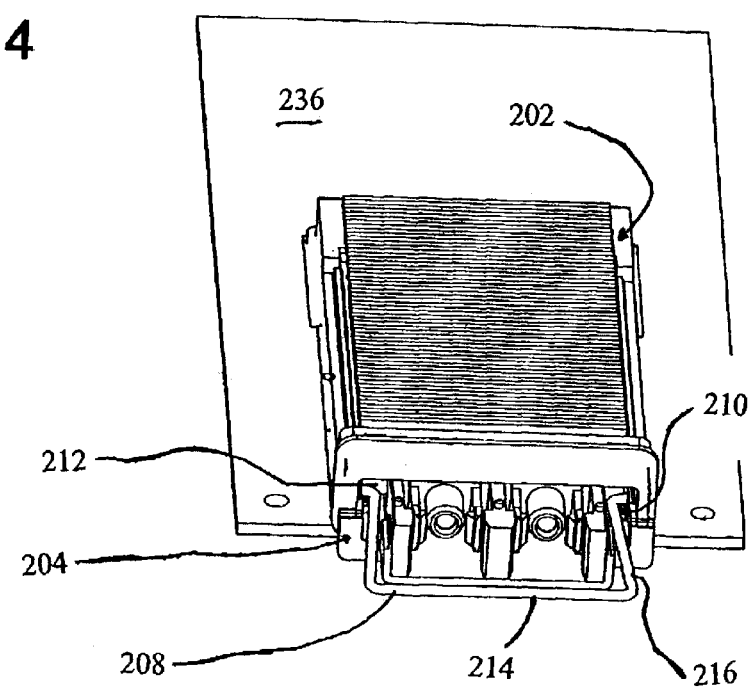
FIG. 14 is a similar view as FIG. 14, taken at a different angle, but illustrating the bail latch in a lowered position, wherein the module is disengaged with the adapter frame and the free ends of the bail latch are cammed out of engagement with the adapter frame.

FIGS. 13–19 illustrate the interaction of the bail latch free ends and the module adapter frame more clearly. In FIG. 13, the assembly 200 is shown as an adapter frame 202 that has a pair of side walls which are interconnected by rear and front members. The adapter frame 202 is shown mounted to a circuit board 236 and the frame holds an electronic module 204 therein. The module shown is an optical transceiver, but it will be understood that other suitable types of components may be used as modules.

The module 204 has a pair of openings 206 that communicate with its front face to permit the coupling thereto of cables and the like. The module 204 is equipped with a moveable bail latch 208 of the type described previously. The bail latch 208 has a U-shape with a base 214 that may by moved up or down into and out of interference with the module openings 206, and a pair of legs 216 that terminate in free ends 218. These legs 216 are moveable, or pivotable, within slots 212 disposed within the module 204 and they move, or pivot around their associated free ends 218. A cam member 210 is shown disposed within the slots 212 in a position to interfere with the movement of the bail latch 208, particularly the legs 216 thereof.

Figure 15:
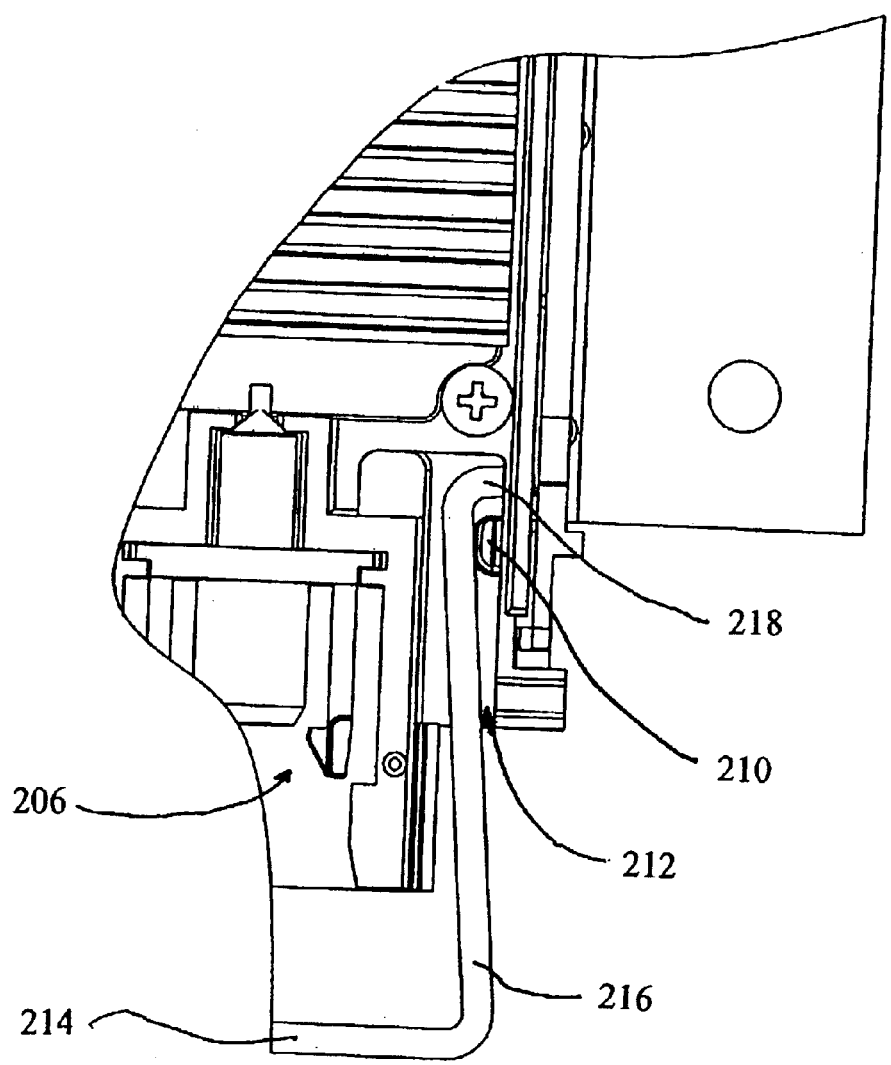
FIG. 15 is an enlarged, partial top plan detail view of the cam member and the bail latch when the module is in the position as illustrated in FIG. 14.
Figure 16:
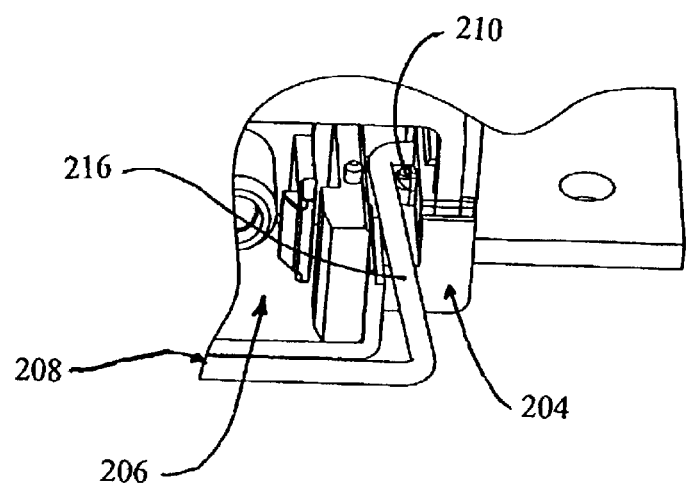
FIG. 16 is an angled enlarged detail view of the bail latch-cam member engagement when the bail latch is in a lowered position as shown in FIG. 14.
Figure 17:
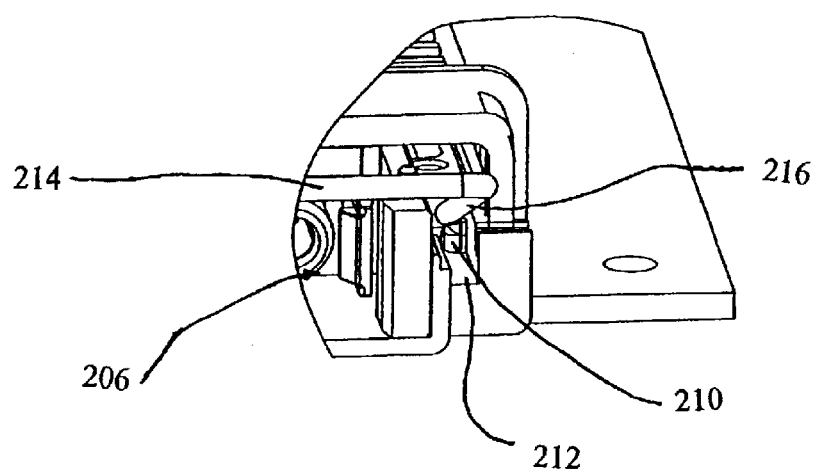
FIG. 17 is a view similar to that of FIG. 16, but of the bail latch-cam member in the position when the module is in the position as illustrated in FIG. 13.
Figure 18:
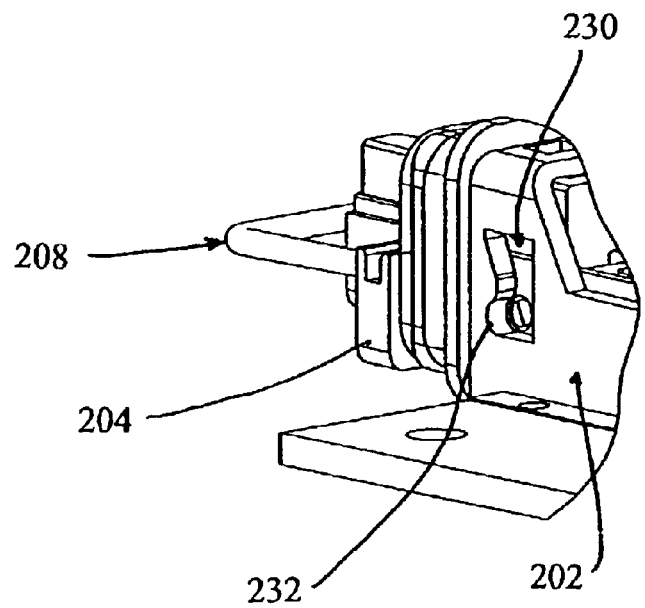
FIG. 18, is an enlarged detail view of the front side of the module as illustrated in FIG. 14, showing one free end of the bail latch disengaged from the adapter frame and the bail latch in front of the opening of the module to prevent insertion of a cable or other device therein; and, FIG. 19, is an enlarged detail view of the front side of the module as illustrated in FIG. 13, showing one free end of the bail latch engaged with the adapter frame and the bail latch raised above the opening of the module to permit insertion of a cable or other device therein.

As discussed above in this description, the cam member 210 is positioned in the module 204, and preferably within the slots 212 thereof. It is positioned so that movement of the bail latch 208 causes the leg portions 216 thereof to contact the cam member 210. These leg portions 216 ride over the cam member 210, and the exterior surfaces thereof. This movement, as explained above, draws the free ends 218 of the bail latch inwardly and outwardly with respect to an imaginary centerline of the free ends. FIG. 18 illustrates the bail latch 208 in an insertion/removal position, where the bail latch 208 extends in front of and prevents the user from inserting a cable into the module opening 206. At this position, the bail latch leg portions 216 are cammed inwardly, as best illustrated in FIG. 15 and lie, preferably in abutting contact, against the cam member 210 as illustrated. This cam member 210 has a profile that extends upwardly from the floor of the module slot 206, as shown in FIG. 13, and need not have the quarter-spherical configuration shown in the preceding drawing Figures. Moreover, the quarter-spherical configuration may be positioned on the top of a post portion 234 to specify the point exactly where the camming action occurs in the rotation of the bail latch. The free ends 218 of the bail latch 208 have a length that is sufficient for them to clear engagement of the exterior adapter frame 202, so that the module may be inserted and removed without problem.

Figure 19:
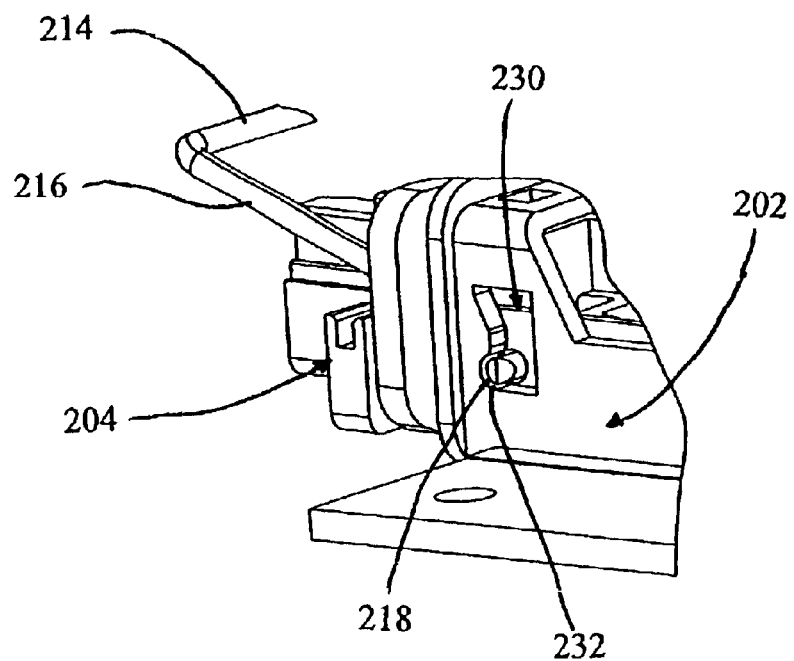

Also, as illustrated in FIGS. 18 & 19, the attachment aperture 230 may be specially configured to include an arcuate recess 232 that receives the bail latch free end 218 therein when the bail latch is in the engaged position. The aperture 230 is aligned with the corresponding apertures formed in the bail latch in which the free ends 218 reside. The free ends 218 of the bail latch are shown in a retracted position in FIG. 18.

It will be understood that the invention may be embodied in other specific forms without departing from the spirit thereof. For example, although the cam has been described as having a partially spherical (quarter spherical) engagement face, other faces may be utilized so long as the camming action is provided. The present examples and embodiments, therefore, are to be considered in all respects as illustrative and not restrictive, and the invention is not to be limited to the details given herein.

What is claimed is:

1. An adapter module for insertion into and removal from an adapter frame mounted on a printed circuit board, the module comprising:
   a conductive body having an interior space for housing an electronic converter therewithin, said conductive body having a pair of side walls and an aperture through at least one of said side walls;
   a retention member swingably mounted to said conductive body, said retention member being a U-shaped retention member having spaced-apart sides and a longitudinal cross member connecting said spaced-apart sides, said retention member having a free end of each of said spaced-apart sides, each said free end being received on respective said side walls of the body, one of said free ends being received within said aperture, whereby
   said retention member is moveable between a first position at which said free ends are out of securing engagement with an adapter frame for an electronic component and a second position at which at least one of said free ends projects out of said aperture and into securing engagement with the adapter frame.

2. The adapter module in accordance with claim 1, further including a cam member positioned for interference engagement with said retention member to thereby effect movement of said at least one free end between being out of securing engagement and being in securing engagement with the adapter frame during movement of said retention member between said first position and said second position.

3. The adapter module in accordance with claim 2, wherein said cam member is a stationary raised surface disposed in said body proximate to said side wall aperture.

4. The adapter module in accordance with claim 3, wherein said side of the retention member which has said free end associated with said aperture slidingly engages said cam member and moves said free end inwardly and from said second position to said first position in response to swinging movement of said retention member.

5. The adapter module in accordance with claim 1, wherein said first position of the retention member blocks access to said interior space of the conductive body.

6. The adapter module in accordance with claim 1, wherein said conductive body has a longitudinal slot extending lengthwise of said conductive body on each of said side walls, each said slot being adapted to receive a complementary member of an adapter frame for an electronic component during its connection to said adapter module.

7. The adapter module in accordance with claim 6, wherein at least one of said slots has a rear portion with an angled wall to define a diverging angled lead-in surface which permits tilted entry of a complementary component of said adapter frame into said slot.

8. The adapter module in accordance with claim 1, wherein said longitudinal cross member of the retention member includes a recess for accommodating a component projecting from the front of said adapter module.

9. An adapter module for insertion into and removal from a frame for an electrical component, the module comprising:
   a body housing an operational electronic component, the body including at least one passage formed therein;
   a retainer member moveably mounted to said body, said retainer member having spaced-apart sides connected together by a cross member in order to define a bail member, at least one said side of the bail member having a free end extending outwardly therefrom and disposed within an associated passage of said body, and said retainer member is moveable between a first position at which said free end of the bail member is inwardly directed with respect to said module body and a second position at which said free end of said bail member projects beyond said module body at said passage location, whereby said free end of said bail member is positioned for engagement of an electronic component to be connected to another component by means of said adapter module.

10. The adapter module in accordance with claim 9, further including a cam member position for interference engagement with said retainer member to thereby effect movement of one free end between being out of securing engagement and being in securing engagement with the adapter frame during movement of said retainer member between said first position and said second position.

11. The adapter module in accordance with claim 9, wherein said cam member includes a stationary raised surface disposed within said passage and wherein said spaced-apart side of said retainer member which has said free end slidingly engages said cam member and moves said free end inwardly and from said second position to said first position in response to swinging movement of said retainer member.

12. The adapter module in accordance with claim 11, wherein said stationary surface includes a quarter-spherical surface.

13. An adapter module and adapter frame combination, comprising:
   an adapter module including a conductive body having an interior space, a pair of spaced apart side walls, a pair of apertures, one in each of said side walls, an electronic converter disposed within the conductive body, and a generally U-shaped retention member having spaced-apart sides with a longitudinal cross member connecting said spaced-apart sides, a pair of free ends projecting in generally opposite directions from said respective spaced apart sides, said free ends being received in said respective apertures of the side walls of the adapter module;
   an adapter frame mounted on a printed circuit board, a pair of spaced-apart frame side walls having an opening, each opening being in general correspondence with respective said apertures when said adapter frame slideably receives said adapter module; and,
   said retention member is moveable between a first position and a second position, wherein said respective free ends of said retention member are positioned to allow the adapter module to be slideably inserted into said adapter frame at said first position, and each said free end extends outwardly of its respective said side wall of said adapter module and is received in one of said openings of said adapter frame when at said second position.

14. The adapter module and frame in accordance with claim 13, wherein said adapter frame has a front opening for slideably receiving said adapter module, and said free ends of the retention member are positioned within said side walls of the adapter module when the retention member is at said first position.

15. The adapter module and frame in accordance with claim 14, further including a pair of cam members position for interference engagement with said retention member to thereby effect movement of said respective free ends between being within said side walls of the adapter module and being outwardly projecting beyond said side walls of the adapter module during movement of said retention member between said first position and said second position, and wherein each said cam member is a stationary raised surface proximate to each said aperture through each said side wall of the adapter module.

16. The adapter module and frame in accordance with claim 15, wherein said respective sides of the retention member slidingly engage said respective cam members and move said respective free ends inwardly and from said second position to said first position in response to swinging movement of said retention member.

17. The adapter module and frame in accordance with claim 13, wherein said first position of the retention member blocks access to said interior space of the conductive body.

18. The adapter module and frame in accordance with claim 13, wherein said conductive body has a longitudinal slot on each of said side walls, each said slot being adapted to receive a complementary member of said adapter frame for an electronic component during its connection to said adapter module.

19. An adapter module and adapter frame combination, comprising:

an adapter module having a supportive structure, said supportive structure having one or more passage locations permitting access into the supportive structure, said adapter module further having a generally U-shaped retention member moveably mounted thereto, said retention member having spaced-apart sides and a cross member connecting said spaced-apart sides to define said generally U-shaped retention member, said retention member terminating in two free ends that are positioned to selectively project outwardly at said passage location;

an adapter frame of an electronic component, said frame being sized and shaped to receive said adapter module, said adapter frame having a receptacle; and, said retention member being moveable between a first position at which said free ends thereof are disengaged from the frame receptacle and a second position at which said free ends thereof are moved partially out of said module supportive structure and into engagement with adapter frame receptacle.

20. The adapter module and frame in accordance with claim 19, further including a pair of cam members positioned to interferingly engage said retention member free ends to effect movement of said at free ends between disengagement and engagement with said adapter frame during movement of said retainer member between said first and second positions, said cam members including stationary, raised surfaces of said supportive structure that are disposed proximate to said supportive structure passages, and wherein said free end slidingly engage said cam members to move said free ends inwardly and from said second position to said first position in response to movement of said retention member.

* * * * *